(12) United States Patent
Fujihara

(10) Patent No.: US 11,385,283 B2
(45) Date of Patent: Jul. 12, 2022

(54) CHUCK TOP, INSPECTION APPARATUS, AND CHUCK TOP RECOVERY METHOD

(71) Applicant: TOKYO ELECTRON LIMITED, Tokyo (JP)

(72) Inventor: Jun Fujihara, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 193 days.

(21) Appl. No.: 16/741,289

(22) Filed: Jan. 13, 2020

(65) Prior Publication Data

US 2020/0225282 A1 Jul. 16, 2020

(30) Foreign Application Priority Data

Jan. 16, 2019 (JP) .............................. JP2019-005288

(51) Int. Cl.
*G01R 31/28* (2006.01)

(52) U.S. Cl.
CPC ..... *G01R 31/2887* (2013.01); *G01R 31/2891* (2013.01); *G01R 31/2893* (2013.01)

(58) Field of Classification Search
CPC ................ G01R 1/06705; G01R 29/12; G01R 31/2808; G01R 31/2887
See application file for complete search history.

(56) References Cited

U.S. PATENT DOCUMENTS

| | | | |
|---|---|---|---|
| 6,414,478 B1* | 7/2002 | Suzuki | G01R 31/2851 324/750.2 |
| 2012/0247671 A1* | 10/2012 | Sugawara | H01L 21/68728 156/345.31 |

FOREIGN PATENT DOCUMENTS

| | | |
|---|---|---|
| JP | 2010-186998 A | 8/2010 |
| KR | 10-2001-0080717 A | 8/2001 |
| KR | 10-2018-0043815 A | 4/2018 |

* cited by examiner

*Primary Examiner* — Tung X Nguyen
(74) *Attorney, Agent, or Firm* — Nath, Goldberg & Meyer; Jerald L. Meyer; Tanya E. Harkins

(57) ABSTRACT

There is provided a chuck top for use in an inspection apparatus which inspects a plurality of inspection target devices formed on a wafer. The chuck top is configured to be held by a frame during an inspection of the plurality of inspection target devices while holding the wafer, the chuck top being configured to be attachable to and detachable from an aligner. The chuck top includes a main body, and a drop prevention mechanism provided in the main body and including a movable drop prevention hook configured to prevent the chuck top from being dropped when the chuck top is detached from the frame.

13 Claims, 6 Drawing Sheets

CHUCK TOP, INSPECTION APPARATUS, AND CHUCK TOP RECOVERY METHOD

CROSS-REFERENCE TO RELATED APPLICATION

This application is based upon and claims the benefit of priority from Japanese Patent Application No. 2019-005288, filed on Jan. 16, 2019, the entire contents of which are incorporated herein by reference.

TECHNICAL FIELD

The present disclosure relates to a chuck top, an inspection apparatus, and a chuck top recovery method.

BACKGROUND

In a semiconductor device manufacturing process, electrical inspection of a plurality of devices (IC chips) formed on a semiconductor wafer (hereinafter simply referred to as a wafer) is performed at a stage where all processes for the wafer are completed. An inspection apparatus that performs such electrical inspection generally includes a prober and a tester. The prober includes a wafer stage, a wafer alignment mechanism, and a wafer transfer system. A probe card having probes that come into contact with the devices formed on the wafer is mounted on the prober. The tester applies electrical signals to the devices through the probe card to test various electrical characteristics of the devices.

As such an inspection apparatus, Patent Document 1 proposes performing an inspection by holding a wafer on a wafer tray (chuck top) while being attached onto the wafer tray, and attaching the wafer tray onto the probe card by virtue of evacuation. In Patent Document 1, a support device is provided to prevent the wafer tray from being dropped. The support device includes four holders that support the wafer tray from below. The holders are configured to be opened and closed by a motor, a ball screw mechanism, and the like.

PRIOR ART DOCUMENT

[Patent Document]
Patent Document 1: Japanese Laid-Open Patent Publication No. 2010-186998

SUMMARY

According to an embodiment of the present disclosure, there is provided a chuck top for use in an inspection apparatus which inspects a plurality of inspection target devices formed on a wafer, wherein the chuck top is configured to be held by a frame during an inspection of the plurality of inspection target devices while holding the wafer, the chuck top being configured to be attachable to and detachable from an aligner, the chuck top including: a main body; and a drop prevention mechanism provided in the main body and including a movable drop prevention hook configured to prevent the chuck top from being dropped when the chuck top is detached from the frame.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
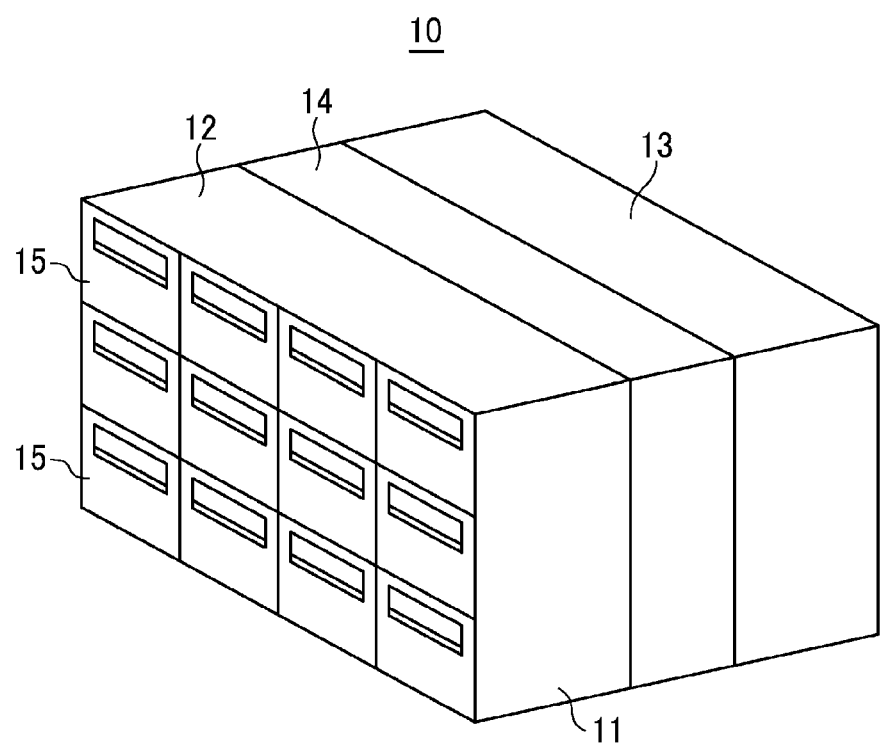
FIG. 1 is a perspective view schematically illustrating an example of an inspection system equipped with a plurality of inspection apparatuses each having a chuck top according to an embodiment.
Figure 2:
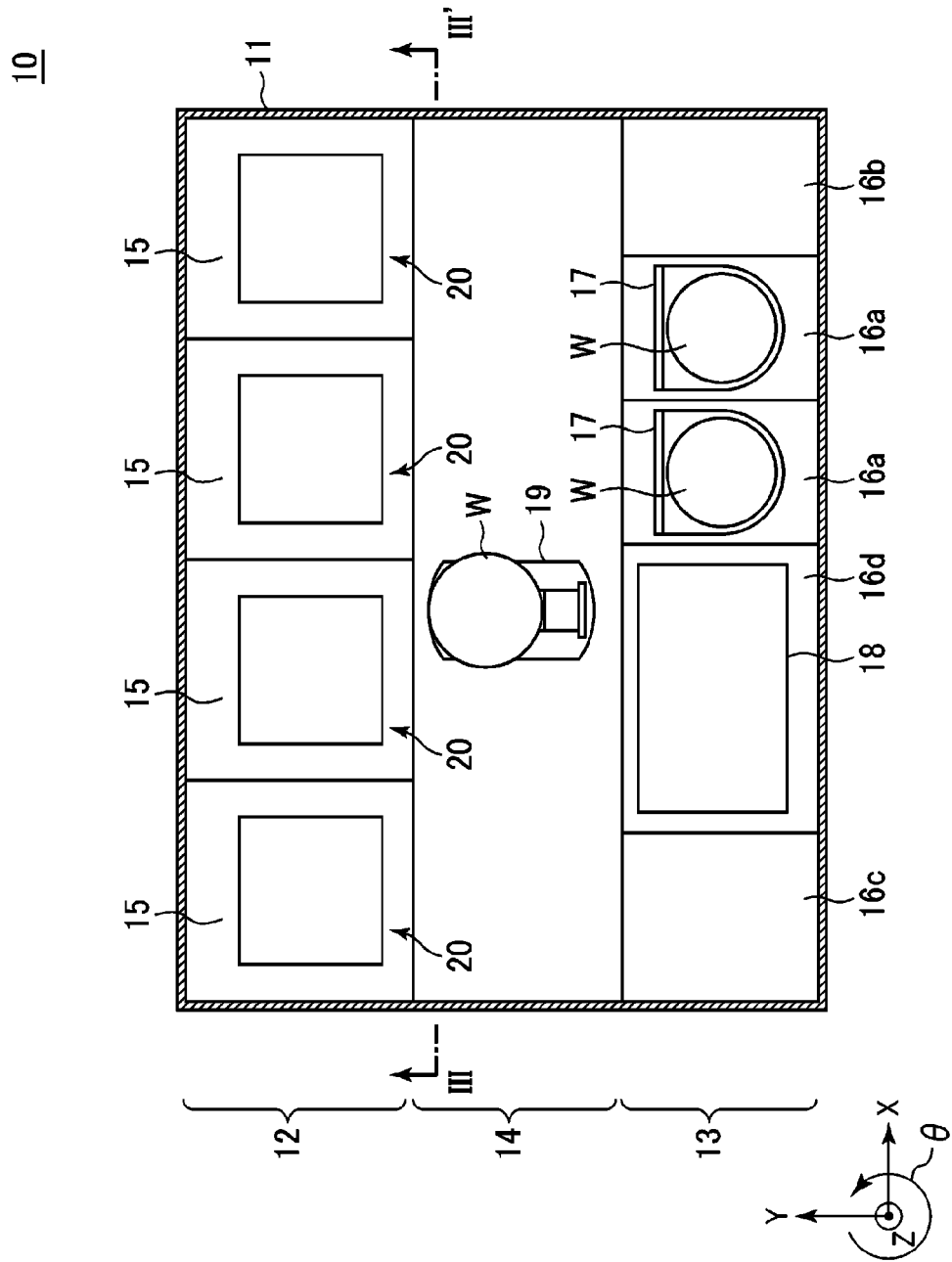
FIG. 2 is a plan view of the inspection system of FIG. 1.
Figure 3:
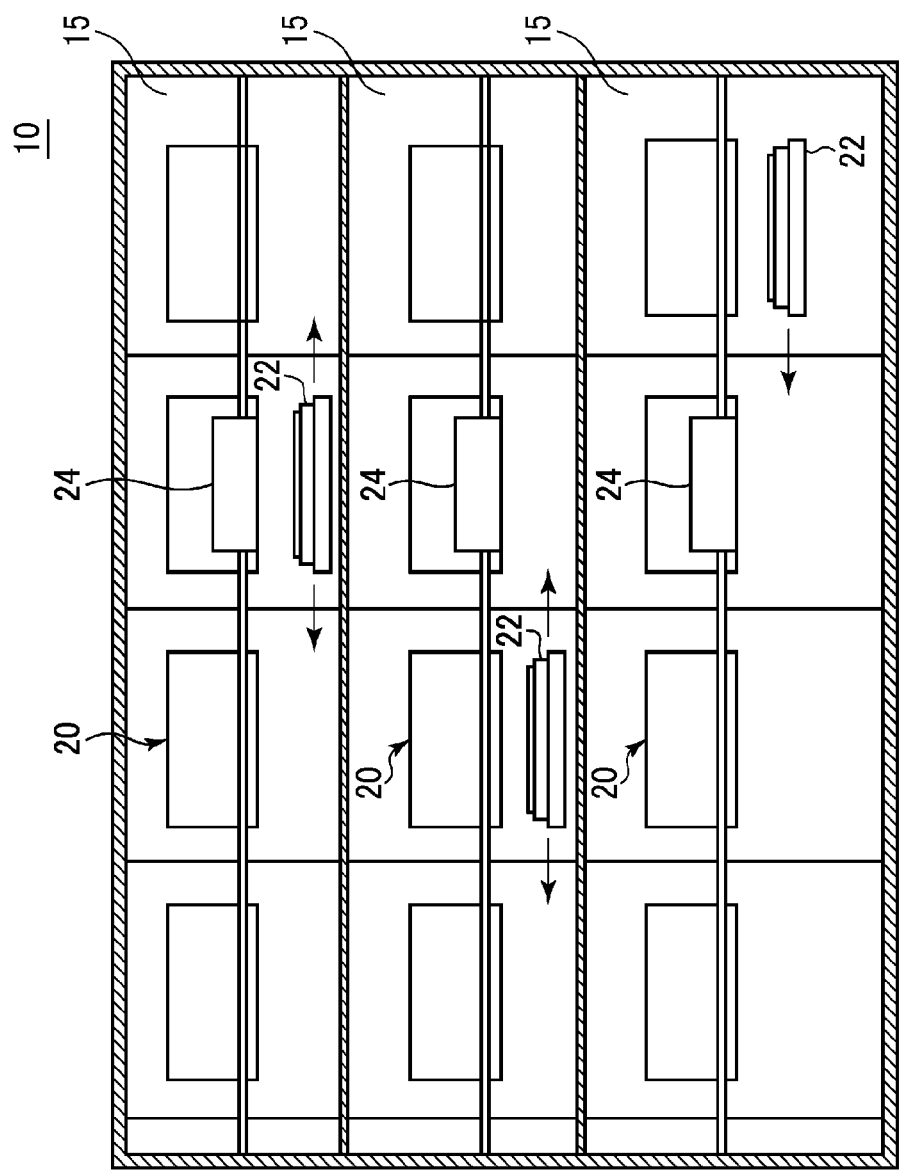
FIG. 3 is a cross-sectional view taken along line in FIG. 2.

FIG. 1 is a perspective view schematically illustrating an exemplary inspection system equipped with a plurality of inspection apparatuses each having a chuck top according to an embodiment. FIG. 2 is a plan view of the inspection system. FIG. 3 is a cross-sectional view taken along line in FIG. 2. An inspection system 10 of the present embodiment is provided to inspect electrical characteristics of a plurality of devices under test (DUTs) formed on a semiconductor wafer (hereinafter simply referred to as a "wafer") W which is an inspection object.

The inspection system 10 includes a housing 11 and has a rectangular parallelepiped shape as a whole. An inspection part 12 having a plurality of inspection rooms (cells) 15, a loader part 13 that loads and unloads the wafer W into and from each inspection room 15, and a transfer part 14 provided between the inspection part 12 and the loader part 13 are included in the housing 11.

In the inspection part 12, four inspection rooms 15 are arranged in a horizontal direction to form cell rows. The cell rows are arranged in three stages in a vertical direction. In each inspection room 15, an inspection apparatus 20 having a tester 30 is provided to inspect the DUTs.

For each stage of the cell rows, a single aligner (stage) 22 is provided below the inspection apparatuses 20 so as to be movable in the X direction in FIG. 2. In addition, a single upper camera 24 for alignment is provided at each stage of the inspection part 12 such that the upper camera 24 is movable in a portion closer to the transfer part 14 than the inspection apparatus 20 in the X direction.

The loader part 13 is partitioned into a plurality of ports. The ports include a plurality of wafer loading/unloading ports 16a each configured to receive a FOUP 17, which is a container for accommodating the plurality of wafers W, a pre-alignment part 16b configured to align the wafers to be transferred, a probe card loader 16c through which a probe card is loaded or unloaded, and a control port 16d in which a system controller 18 configured to control the operation of the inspection system 10 is accommodated.

A transfer mechanism 19 having a plurality of transfer arms is disposed in the transfer part 14. A main body of the transfer mechanism 19 is movable in the X direction, the Z direction, and the θ direction, and the transfer arms are movable in the front-rear direction (Y direction). Thus, the transfer mechanism 19 is configured to move the wafer W in the X direction, the Y direction, the Z direction, and the θ direction. The transfer mechanism 19 is accessible to the inspection rooms 15 of all stages. The transfer mechanism 19 receives the wafer W from each wafer loading/unloading port 16a of the loader part 13, and transfers the same to a chuck top (stage) 60 (to be described later) of the inspection apparatus 20 (see FIGS. 4 to 6 which will be described later). Then, the transfer mechanism 19a receives the wafer W which has been subjected to an inspection of electrical characteristics of the devices from the chuck top 60 of the corresponding inspection apparatus 20, and transfers the same to the wafer loading/unloading port 16a. At this time, the delivery of the wafer W to the chuck top 60 is performed using the aligner 22.

Further, the transfer mechanism 19 transfers a probe card, which requires maintenance, from each inspection room 15 to the probe card loader 16c, or transfers a new or maintained probe card to each inspection room 15.

Next, the inspection apparatus 20 will be described in detail.

Figure 4:
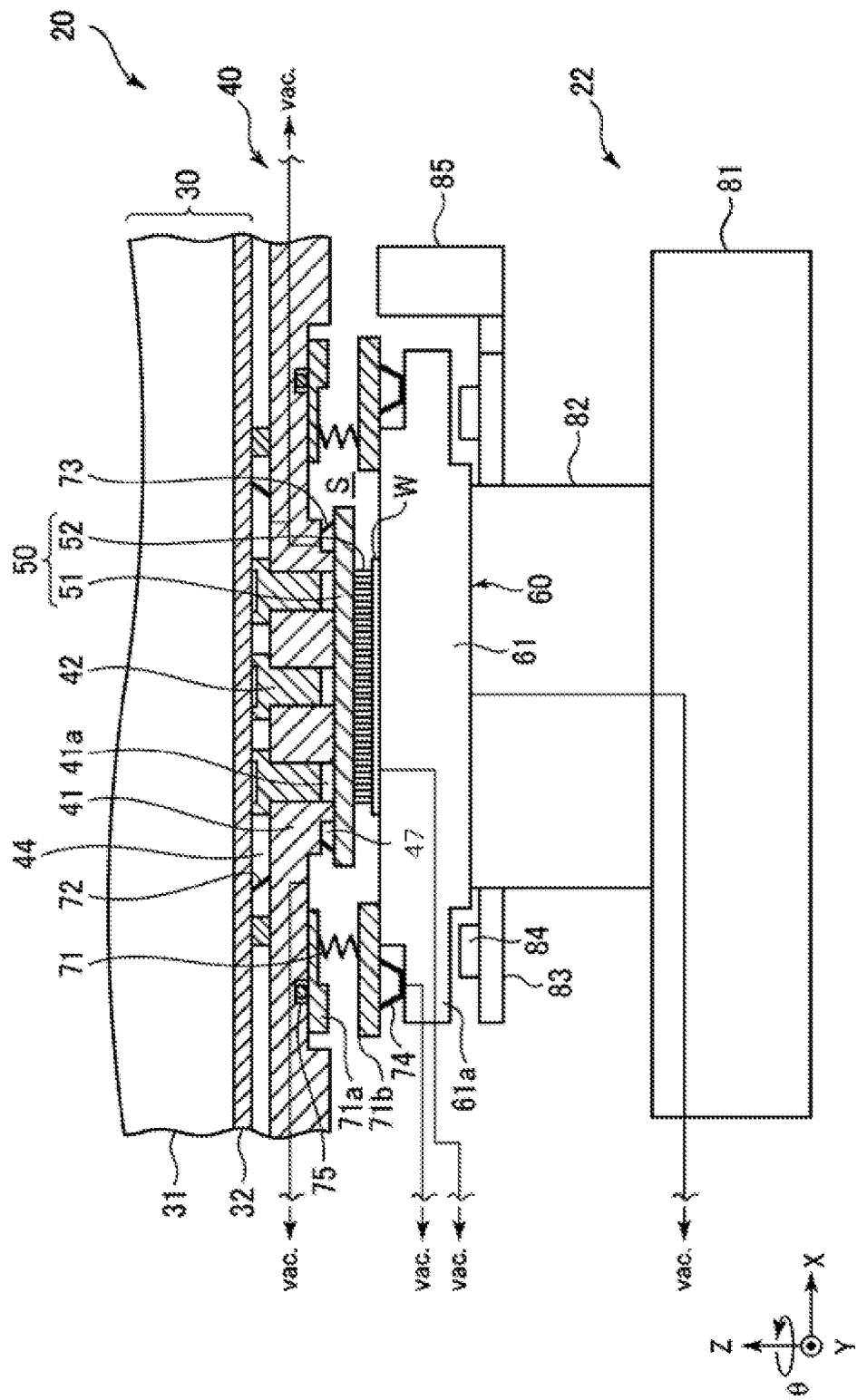
FIG. 4 is a view illustrating a schematic configuration of an inspection apparatus.
Figure 5:
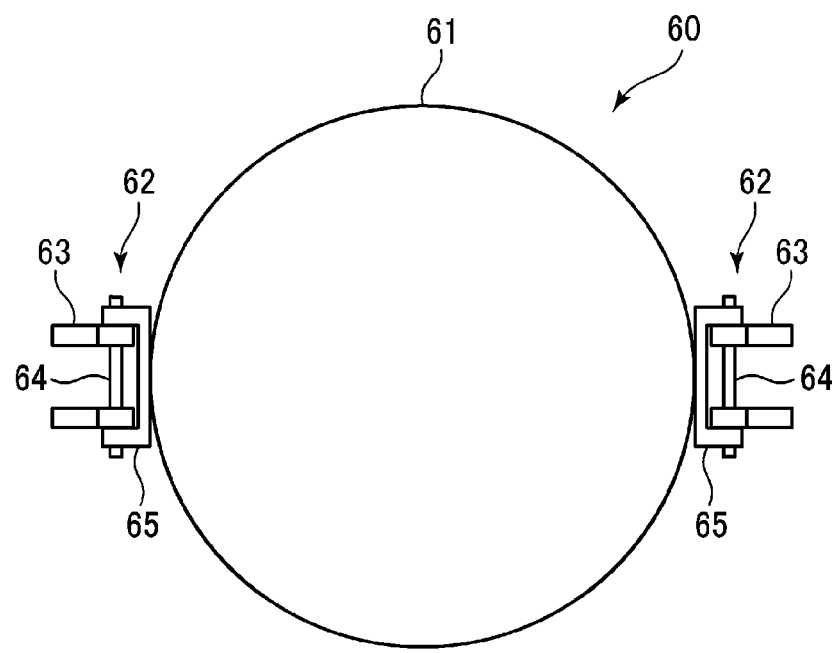
FIG. 5 is a plan view schematically illustrating a chuck top according to an embodiment.
Figure 6:
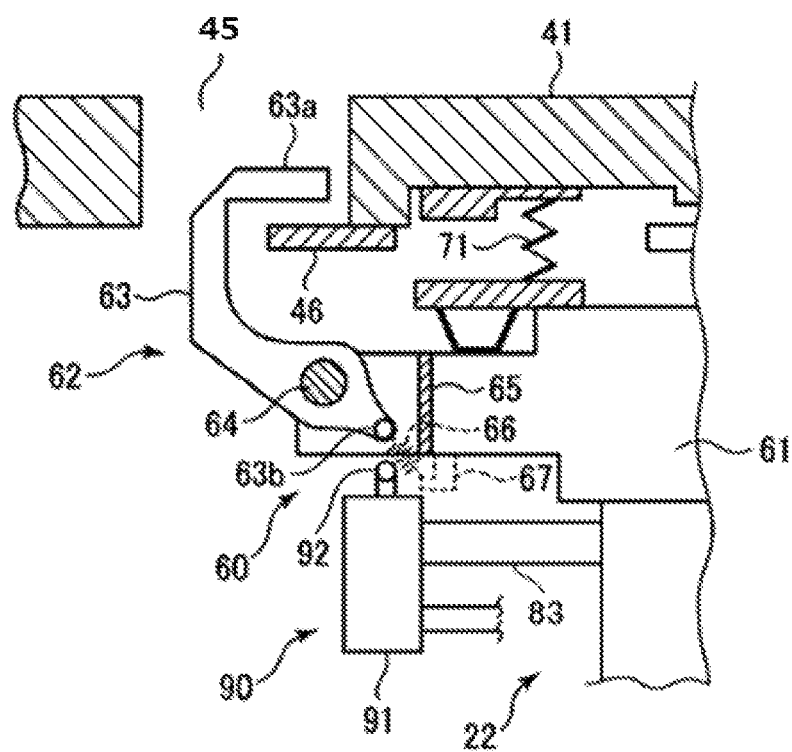
FIG. 6 is a cross-sectional view schematically illustrating a main part of the inspection apparatus.

FIG. 4 is a cross-sectional view illustrating a schematic configuration of the inspection apparatus 20 provided in each inspection room 15. FIG. 5 is a plan view schematically illustrating the chuck top 60, and FIG. 6 is a cross-sectional view schematically illustrating the main part of the inspection apparatus 20.

The inspection apparatus 20 includes the tester 30, an intermediate connection member 40, a probe card 50, and the chuck top 60. The aligner 22 described above is common to the four inspection apparatuses 20 in each stage, and is included in the inspection apparatus 20. In the inspection apparatus 20, an inspection of the electrical characteristics of the DUTs formed on the wafer W is performed by the tester 30 via the probe card 50.

The tester 30 performs the inspection by applying electrical signals to the DUTs formed on the wafer W, and includes a test head 31 accommodating a plurality of inspection circuit boards (not illustrated) and a tester motherboard 32. The tester motherboard 32 has a plurality of terminals (not illustrated) provided on the bottom thereof, and is coupled to the probe card 50 via the intermediate connection member 40. Each inspection circuit board is connected to the tester motherboard 32, and inspects the DUTs of the wafer W by applying electrical signals to the DUTs of the wafer in accordance with various test items.

The probe card 50 includes a plate-shaped base 51 having a plurality of terminals (not illustrated) provided on an upper surface thereof, and a plurality of probes 52 provided on a lower surface of the base 51. The plurality of probes 52 are brought into contact in batch with all the electrodes of all the DUTs formed on the wafer W. The wafer W is positioned by the aligner 22 while being attached to the chuck top 60 so that the probes come into contact with the plurality of DUTs, respectively.

The intermediate connection member 40 is provided to electrically connect the tester 30 and the probe card 50, and includes a pogo frame 41 and pogo blocks 42 inserted into respective through-holes 41a formed in the pogo frame 41. Each pogo block 42 has a number of pogo pins arranged thereon, and connects the terminals of the tester motherboard 32 and the terminals of the base 51 of the probe card 50.

As illustrated in FIGS. 5 and 6, the chuck top 60 includes a main body 61 and a pair of drop prevention mechanisms 62. The pair of drop prevention mechanisms 62 are provided at positions facing each other in the peripheral edge portion (end portion) of the main body 61. In the cross-sectional view of FIG. 4, a portion where the drop prevention mechanisms 62 are out of sight is illustrated. The drop prevention mechanisms 62 serves to prevent the chuck top 60 from being dropped.

Vacuum-suction ports are formed in an upper surface of the main body 61 of the chuck top 60. The wafer W is placed on the upper surface of the main body 61. The wafer W is vacuum-attached by a vacuum mechanism via the vacuum-suction ports so that the wafer W is vacuum-attached to the main body 61. When the wafer W is transferred, the chuck top 60 is connected and vacuum-attached to the aligner 22. A stepped portion 61a is formed on a periphery of the upper surface of the main body 61. A seal member 74 is disposed on the stepped portion 61a.

The drop prevention mechanism 62 includes a drop prevention hook 63 rotatably provided in a vertical plane, a rotation shaft 64 of the drop prevention hook 63, a support member 65 attached to the main body 61 so as to support the rotation shaft 64, and a spring 66 (see FIGS. 5 and 6). The drop prevention hook 63 is rotatable between a drop prevention position as illustrated in FIG. 6 and a drop prevention release position (to be described later) where the drop prevention function is released. The drop prevention hook 63 has a tip portion 63a. When the drop prevention hook 63 is at the drop prevention position, the tip portion 63a is inserted into a hole 45 formed in the pogo frame 41. In addition, an engagement portion 46 with which the tip portion 63a of the drop prevention hook 63 is engaged is provided in the hole 45.

The drop prevention hook 63 has a lever 63b provided on a side opposite the tip portion 63a with the rotation shaft 64 interposed therebetween. When the lever 63b is raised by a release mechanism 90 described later, the drop prevention hook 63 is rotated to the drop prevention release position. The spring 66 is attached to an attachment portion 67 provided on the main body 61 of the chuck top 60 and the lever 63b, so that the drop prevention hook 63 is biased from the drop prevention release position to the drop prevention position.

Figure 7:
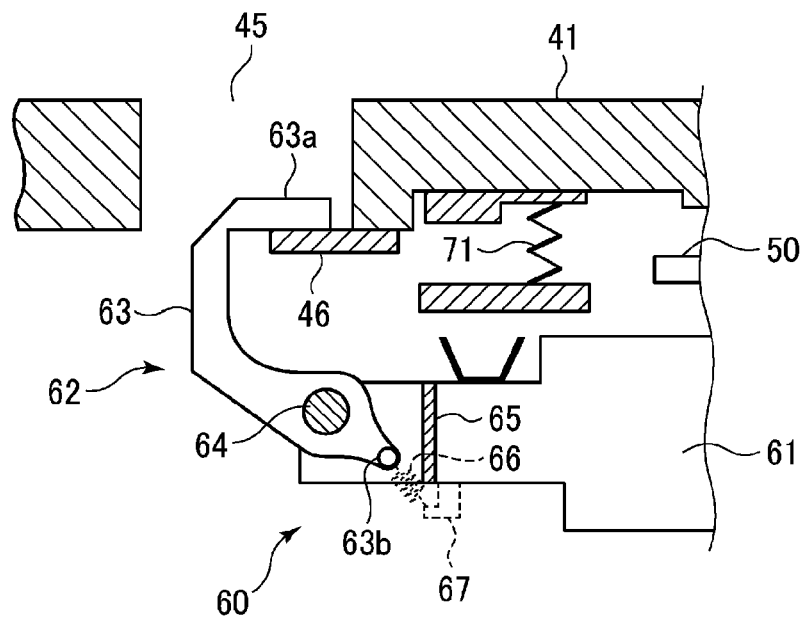
FIG. 7 is a cross-sectional view illustrating a state in which the chuck top is detached from a pogo frame and a drop prevention hook is engaged with an engagement portion of the pogo frame.

As will be described later, the chuck top 60 and the probe card 50 are attached to the pogo frame 41 by vacuum suction using factory power. Thus, when the factory power stops, the chuck top 60 and the probe card 50 may be dropped and damaged. The drop prevention mechanism 62 prevents the chuck top 60 from dropping. That is, in a case where the factory power is stopped during the inspection of the wafer W, the vacuum suction of the chuck top 60 is released and the chuck top 60 is detached from the pogo frame 41. In that case, as illustrated in FIG. 7, the drop prevention hook 63 is engaged with the engagement portion 46 so that the chuck top 60 is prevented from falling. The drop prevention function by the drop prevention mechanism 62 may be released by rotating the drop prevention hook 63 by the release mechanism 90 (to be described later).

A cylindrical bellows 71 is provided between the pogo frame 41 and the chuck top 60 so as to surround the probe card 50. The bellows 71 is a metal cornice structure, and is configured to be extendable in the vertical direction. Ring-shaped contact portions 71a and 71b are respectively provided at upper and lower ends of the bellows 71. The contact portion 71a comes into contact with the pogo frame 41 via a seal member 75. The contact portion 71b comes into contact with the seal member 74. A space S, which is surrounded by the main body 61 of the chuck top 60, the pogo frame 41, and the bellows 71, is formed when the wafer W comes into contact with the probe card 50. The space S is sealed by the seal members 74 and 75. The space S and the interior of the seal member 74 are evacuated by the vacuum mechanism, whereby the chuck top 60 is held by suction to the pogo frame 41. At this time, the electrodes of each device formed on the wafer W placed on the chuck top 60 come into contact with the respective probes 52 of the probe card 50.

A seal member 72 is provided between the tester motherboard 32 and the pogo frame 41. A space 44 formed by the tester motherboard 32, the pogo frame 41, and the seal member 72 is sealed. The space 44 is evacuated such that the pogo frame 41 is attached to the tester motherboard 32. A seal member 73 is provided between the pogo frame 41 and the probe card 50. A space 47 defined by the pogo frame 41, the probe card 50 and the seal member 73 is sealed. The space 47 is evacuated so that the probe card 50 is held by suction to the pogo frame 41.

The aligner 22 is provided to be attachable to and detachable from the chuck top 60, and holds the chuck top 60 by suction so as to align the wafer W on the chuck top 60 with the probe card 50. As illustrated in FIG. 4, the aligner 22 includes an XY-axis movement part 81 having an X-direction movement part movable in the X direction and a Y-direction movement part movable in the Y direction, a Z block 82 movable in the Y direction together with the Y-direction movement part and movable up and down, and a chuck base 83 attached to the Z block 82. The Z block 82 has a chuck top suction surface. By attracting the chuck top 60 to the Z block 82, it is possible for the aligner 22 to align the chuck top 60 (the wafer W) at the X, Y, Z, and θ positions.

A plurality of height sensors 84 is provided on the periphery of the upper surface of the chuck base 83. The chuck base 83 and the main body 61 of the chuck top 60 are each provided with a plurality of positioning pins and positioning blocks (both not illustrated). In addition, a lower camera 85 for imaging the probe card 50 and the pogo frame 41 is provided at an outer end of the chuck base 83.

Figure 8:
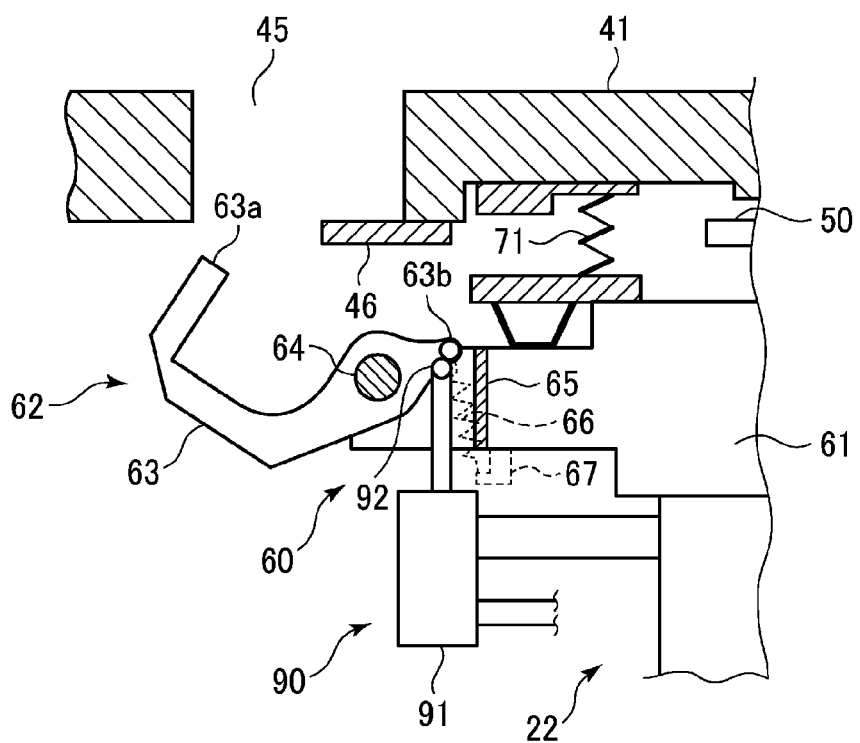
FIG. 8 is a cross-sectional view illustrating a state in which the drop prevention hook is rotated to a drop prevention release position.

In addition, the release mechanism 90 is provided at the outer end of the chuck base 83. The release mechanism 90 releases the drop prevention function of the drop prevention mechanism 62, and includes a cylinder 91 and a release member 92 that can protrude or retract from the cylinder 91. In the state in which the chuck top 60 is mounted on the aligner 22, by positioning the release mechanism 90 at a position corresponding to the drop prevention mechanism 62, and causing the release member 92 of the release mechanism 90 to protrude, the lever 63b of the drop prevention hook 63 is raised and the drop prevention hook 63 rotates to the drop prevention release position illustrated in FIG. 8. By lowering the release member 92 of the release mechanism 90 from the state of FIG. 8, the drop prevention hook 63 returns to the drop prevention position by virtue of the biasing force of the spring 66.

The release of the drop prevention function of the drop prevention mechanism 62 by the release mechanism 90 is performed to recover the chuck top 60 when the chuck top 60 is detached from the pogo frame 41, as illustrated in FIG. 7. In addition, even when the chuck top 60 is aligned by the aligner 22, the drop prevention function of the drop prevention mechanism 62 is released by the release mechanism 90.

Next, the operation of the inspection system 10 will be described.

The wafer W is taken out from the FOUP 17 of the wafer loading/unloading port 16a by the transfer mechanism 19. In the inspection apparatus 20 into which the wafer W is to be loaded, the wafer W is placed on the chuck top 60 in the state where the chuck top 60 is mounted on the aligner 22. At this time, the wafer W placed on the chuck top 60 is imaged by the upper camera 24 and is positioned (aligned). Next, the aligner 22 moves the chuck top 60 to a contact area below the probe card 50. In this process, the probe card 50 is imaged by the lower camera 85, and the wafer W is aligned in the horizontal direction. Then, the chuck top 60 is raised by the Z block 82 of the aligner 22, the wafer W is brought into contact with the probes 51 of the probe card 50, and the chuck top 60 is attached by suction to the pogo frame 41 via the bellows 71. Then, the vacuum-attachment established between the chuck top 60 and the aligner 22 is released, and the Z block 82 of the aligner 22 is lowered. In this state, the electrical inspection of the wafer W by the tester 30 is performed.

After the electrical inspection of the wafer W is completed, the aligner 22 is positioned below the chuck top 60, and the Z block 82 is raised to hold the chuck top 60 by suction. Then, the vacuum state in the space S and the interior of the seal member 74 is released, the Z block 82 of the aligner 22 is lowered, and the inspected wafer W placed on the chuck top 60 is transferred to the FOUP 17 by the transfer mechanism 19.

In the series of operations described above, the drop prevention function of the drop prevention mechanism 62 is released by the release mechanism 90 such that the alignment operation and the like are not hindered during alignment before the chuck top 60 is attached to the pogo frame 41. Specifically, before the chuck top 60 is attached to the pogo frame 41, the release member 92 of the release mechanism 90 is caused to protrude from the cylinder 91 so that the drop prevention hook 63 is rotated to the drop prevention release position. Then, after the chuck top 60 is attached to the pogo frame 41, the drop prevention function is set. Specifically, after the chuck top 60 is attached to the pogo frame 41, the release member 92 is retracted by lowering the Z block 82, and the drop prevention hook 63 is returned to the drop prevention position by virtue of the biasing force of the spring 66.

As described above, during the electrical inspection of the wafer W, since the drop prevention hook 63 is at the drop prevention position as illustrated in FIG. 6 and the drop prevention function is set, the chuck top 60 is prevented from being dropped even if the chuck top 60 is detached from the pogo frame 41. That is, in the case where the vacuum-attachment of the chuck top 60 to the pogo frame 41 is released due to the cutoff of the factory power so that the chuck top 60 is detached from the pogo frame 41, the drop prevention hook 63 is engaged with the engagement portion 46 to prevent the drop of the chuck top 60.

In Patent Document 1 described above, the drop prevention mechanism is a member separately provided from the chuck top, and has a structure equipped with the four holders that support the chuck top from below. Therefore, the conventional drop prevention mechanism requires a large space compared with the case in which the chuck top 60 itself includes the drop prevention mechanism 62 as in the present embodiment. In contrast, in the present embodiment, since the chuck top 60 itself includes the drop prevention mechanism 62, it is not necessary to separately provide the drop prevention mechanism, thus achieving a high space-saving effect. In particular, in the inspection system having the plurality of inspection apparatuses 20 as in the present embodiment, since the space-saving effect is essentially required, the chuck top 60 having the drop prevention mechanism 62 is very effective.

In addition, in Patent Document 1, a lower camera for alignment requires a focal length that is long enough to image a probe card while avoiding a clamp of the drop prevention mechanism. However, an increase in the focal length of the lower camera increases a Z stroke of an aligner. This requires a more enlarged space. In contrast, in the present embodiment, since the lower camera 85 is capable of imaging the probe card without being obstructed by the drop prevention mechanism 62, a camera having a relatively short focal length can be used as the lower camera 85. For this reason, it is possible to shorten the Z stroke of the aligner 22, thus achieving a high space-saving effect.

Next, a method of recovering the detached chuck top 60 will be described.

When the chuck top 60 is detached from the pogo frame 41 during the inspection of the wafer W, the drop prevention hook 63 is engaged with the engagement portion 46 of the pogo frame 41 as illustrated in FIG. 7. In this state, the aligner 22 is positioned below the chuck top 60. At this time, the release member 92 of the release mechanism 90 remains retracted (in a contracted state).

Then, the lower camera 85 detects the position of the chuck top. Based on the detection result, the system controller 18 determines whether it is possible to recover the chuck top 60. If it is determined that the chuck top 60 is in a recoverable state, the Z block 82 of the aligner 22 is raised, and the chuck top 60 is held by the Z block 82 by suction.

In this state, the chuck top 60 is raised by the aligner 22, and the engagement of the drop prevention hook 63 with the engagement portion 46 is released. Next, the release member 92 is caused to protrude. As a result, the lever 63*b* of the drop prevention hook 63 rises, the drop prevention hook 63 rotates to the drop prevention release position illustrated in FIG. 8, and the drop prevention mechanism 62 is released.

Thereafter, the chuck top 60 is recovered by the aligner 22 by lowering the Z block 82 of the aligner 22 holding the chuck top 60. The wafer W held by the chuck top 60 is unloaded by the transfer mechanism 19.

As described above, by using the release mechanism 90 having the release member 92 that can protrude and retract, the drop prevention hook 63 can be released and as a result, it is possible to automatically recover the detached chuck top 60 using the aligner 22 without manual effort. When the chuck top 60 is detached from the pogo frame 41 and the drop prevention hook 63 is engaged with the engagement portion 46, a manual recovery takes time and requires skill as well. In addition, there is a concern that the wafer W held by the chuck top 60 may be damaged. In contrast, in the present embodiment, since it is possible to automatically recover the detached chuck top 60 using the aligner 22, it is possible to shorten a work time. Further, no skill is required, and damage to the wafer W or the like is unlikely to occur.

In addition, in the present disclosure, the release mechanism 90 is provided in the aligner 22 and the aligner 22 is accessible to the plurality of inspection apparatuses 20. Thus, it is not necessary to provide the release mechanism 90 for each inspection apparatus 20. This achieves a high space-saving effect.

Although embodiments have been described above, it should be noted that the embodiments disclosed herein are exemplary in all respects and are not restrictive. The above-described embodiments may be omitted, replaced or modified in various forms without departing from the scope and spirit of the appended claims.

While in the embodiments described above, the inspection system having the plurality of inspection apparatuses has been described by taking, as an example, a single inspection apparatus, the present disclosure is not limited thereto. As an example, a single inspection apparatus may be used in the inspection system.

In addition, while the embodiments described above has been illustrated with the drop prevention mechanism having the drop prevention hook which is extendible by the rotation in the vertical plane, the present disclosure is not limited thereto. For example, the drop prevention mechanism may include a drop prevention hook which is detachable by rotating, for example, in a circumferential direction. The number of drop prevention mechanisms is not limited to two. A frame by which the chuck top is held during the inspection is not limited to the pogo frame, but may be other frame-shaped components provided in the inspection apparatus.

According to the present disclosure in some embodiments, it is possible to provide a chuck top, an inspection apparatus, and a chuck top recovery method which are capable of preventing the chuck top from being dropped while saving space.

What is claimed is:

1. A chuck top for use in an inspection apparatus which inspects a plurality of inspection target devices formed on a wafer,
wherein the chuck top is configured to be held by a frame during an inspection of the plurality of inspection target devices while holding the wafer, the chuck top being configured to be attachable to and detachable from an aligner,
the chuck top comprising:
a main body; and
a drop prevention mechanism provided in the main body and including a movable drop prevention hook configured to prevent the chuck top from being dropped when the chuck top is detached from the frame, wherein the drop prevention hook is configured to be rotatable between a drop prevention position at which the chuck top is prevented from being dropped and a drop prevention release position at which a drop prevention function is released.

2. The chuck top of claim 1, wherein the drop prevention mechanism is provided in plural at an end portion of the main body.

3. The chuck top of claim 1, wherein the drop prevention hook is provided to be rotatable in a vertical plane.

4. An inspection apparatus comprising:
a tester configured to apply electrical signals to a plurality of devices on a wafer and to inspect the plurality of devices;
a probe card connected to the tester and including probes configured to come into contact with electrodes of the plurality of devices on the wafer;

a chuck top configured to hold the wafer;

a frame configured to hold the chuck top during an inspection using the tester; and an aligner provided to be attachable to and detachable from the chuck top, and configured to align the wafer held by the chuck top with respect to the probe card, wherein the chuck top includes:

a main body; and a drop prevention mechanism provided in the main body and including a movable drop prevention hook configured to prevent the chuck top from being dropped when the chuck top is detached from the frame, wherein the drop prevention hook is configured to be rotatable between a drop prevention position at which the chuck top is prevented from being dropped and a drop prevention release position at which a drop prevention function is released.

5. The inspection apparatus of Claim 4, wherein the drop prevention hook is provided to be rotatable in a vertical plane.

6. The inspection apparatus of claim 5, wherein the aligner includes a release mechanism configured to switch the drop prevention hook from the drop prevention position to the drop prevention release position when the chuck top is connected to the aligner.

7. The inspection apparatus of claim 6, wherein the release mechanism includes a cylinder and a release member provided to protrude from the cylinder, and wherein the release mechanism is configured to cause the release member to protrude from the cylinder so that the drop prevention hook is rotated from the drop prevention position to the drop prevention release position.

8. The inspection apparatus of claim 7, wherein the drop prevention mechanism includes a spring configured to bias the drop prevention hook to the drop prevention position when the drop prevention hook is rotated to the drop prevention release position by the release mechanism to stop a release operation by the release mechanism.

9. The inspection apparatus of claim 6, wherein the drop prevention mechanism includes a spring configured to bias the drop prevention hook to the drop prevention position when the drop prevention hook is rotated to the drop prevention release position by the release mechanism to stop a release operation by the release mechanism.

10. The inspection apparatus of claim 4, wherein the drop prevention mechanism is provided in plural at an end portion of the main body.

11. The inspection apparatus of claim 4, wherein the aligner includes a release mechanism configured to switch the drop prevention hook from the drop prevention position to the drop prevention release position when the chuck top is connected to the aligner.

12. A chuck top for use in an inspection apparatus which inspects a plurality of inspection target devices formed on a wafer, wherein the chuck top is configured to be held by a frame during an inspection of the plurality of inspection target devices while holding the wafer, the chuck top being configured to be attachable to and detachable from an aligner, the chuck top comprising:

a main body; and a drop prevention mechanism provided in the main body and including a movable drop prevention hook configured to prevent the chuck top from being dropped when the chuck top is detached from the frame, wherein the drop prevention hook is provided to be rotatable in a vertical plane.

13. An inspection apparatus comprising:

a tester configured to apply electrical signals to a plurality of devices on a wafer and to inspect the plurality of devices;

a probe card connected to the tester and including probes configured to come into contact with electrodes of the plurality of devices on the wafer;

a chuck top configured to hold the wafer;

a frame configured to hold the chuck top during an inspection using the tester; and an aligner provided to be attachable to and detachable from the chuck top, and configured to align the wafer held by the chuck top with respect to the probe card, wherein the chuck top includes:

a main body; and a drop prevention mechanism provided in the main body and including a movable drop prevention hook configured to prevent the chuck top from being dropped when the chuck top is detached from the frame, wherein the drop prevention hook is provided to be rotatable in a vertical plane.

* * * * *